United States Patent
Lederer et al.

(10) Patent No.: US 6,797,029 B2
(45) Date of Patent: Sep. 28, 2004

(54) PROCESS FACILITY HAVING AT LEAST TWO PHYSICAL UNITS EACH HAVING A REDUCED DENSITY OF CONTAMINATING PARTICLES WITH RESPECT TO THE SURROUNDINGS

(75) Inventors: Kay Lederer, Dresden (DE); Steffen Hornig, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/330,444

(22) Filed: Dec. 27, 2002

(65) Prior Publication Data

US 2003/0121417 A1 Jul. 3, 2003

(30) Foreign Application Priority Data

Dec. 27, 2001 (DE) .......................................... 101 64 175

(51) Int. Cl.[7] .............................................. B01D 46/00
(52) U.S. Cl. ................ 55/385.2; 55/DIG. 18; 55/DIG. 29; 55/DIG. 46; 454/49; 454/56; 454/59; 454/184; 454/187; 454/188; 454/189
(58) Field of Search ........................ 55/385.2, DIG. 18, 55/DIG. 29, DIG. 46; 454/49, 56, 59, 184, 187, 188, 189

(56) References Cited

U.S. PATENT DOCUMENTS

| | | | |
|---|---|---|---|
| 4,801,312 A | * 1/1989 | Mateson | ..................... 55/385.2 |
| 4,927,438 A | * 5/1990 | Mears et al. | ................ 55/385.2 |
| 5,145,303 A | 9/1992 | Clarke | |
| 5,425,793 A | * 6/1995 | Mori et al. | ................. 55/385.2 |
| 5,752,796 A | 5/1998 | Muka | |
| 5,788,567 A | 8/1998 | Chang et al. | |
| 5,833,726 A | 11/1998 | Kinkead et al. | |
| 5,858,041 A | * 1/1999 | Luetkemeyer | .............. 55/385.2 |
| 6,358,139 B1 | * 3/2002 | Renz | ........................... 454/187 |
| 6,626,971 B1 | * 9/2003 | Forbert et al. | ............. 55/385.2 |
| 6,632,260 B1 | * 10/2003 | Siemers et al. | ............ 55/385.2 |

FOREIGN PATENT DOCUMENTS

| | | |
|---|---|---|
| DE | 36 37 880 C2 | 9/1994 |
| DE | 199 32 735 | 10/2000 |

* cited by examiner

Primary Examiner—Blaine Copenheaver
Assistant Examiner—Minh-Chau T. Pham
(74) Attorney, Agent, or Firm—Laurence A. Greenberg; Werner H. Stemer; Ralph E. Locher

(57) ABSTRACT

In a process facility for producing semiconductor wafers, a third physical unit is configured between two physical units that produce mini environments. The third physical unit has a laminar flow at right angles to the laminar flows of the two physical units and is operated with a slightly higher flow velocity. According to the Bernoulli equation, the static pressure in the third physical unit is therefore lower than in the surrounding two physical units. Advantageously, therefore, no contamination from the more highly loaded one of the two physical units passes over into the lesser loaded one of the two physical units.

9 Claims, 2 Drawing Sheets

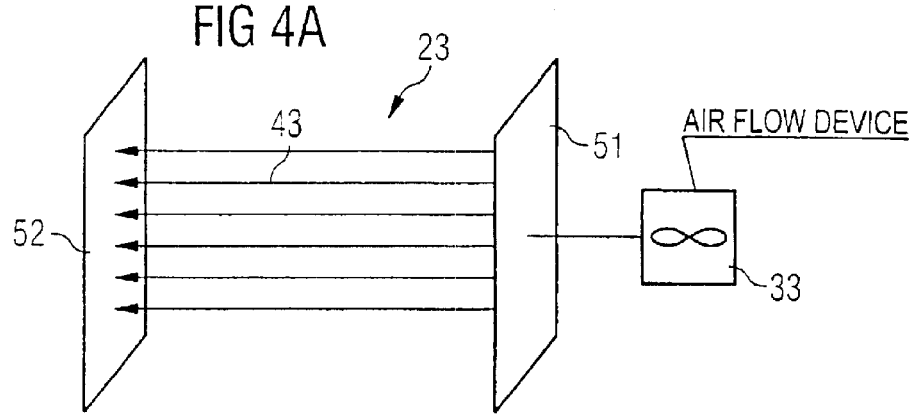
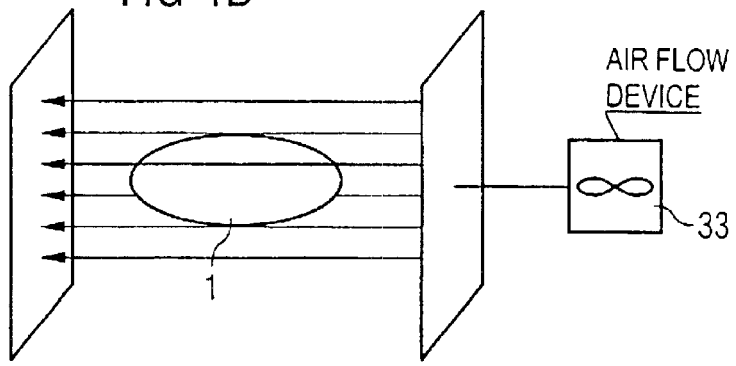
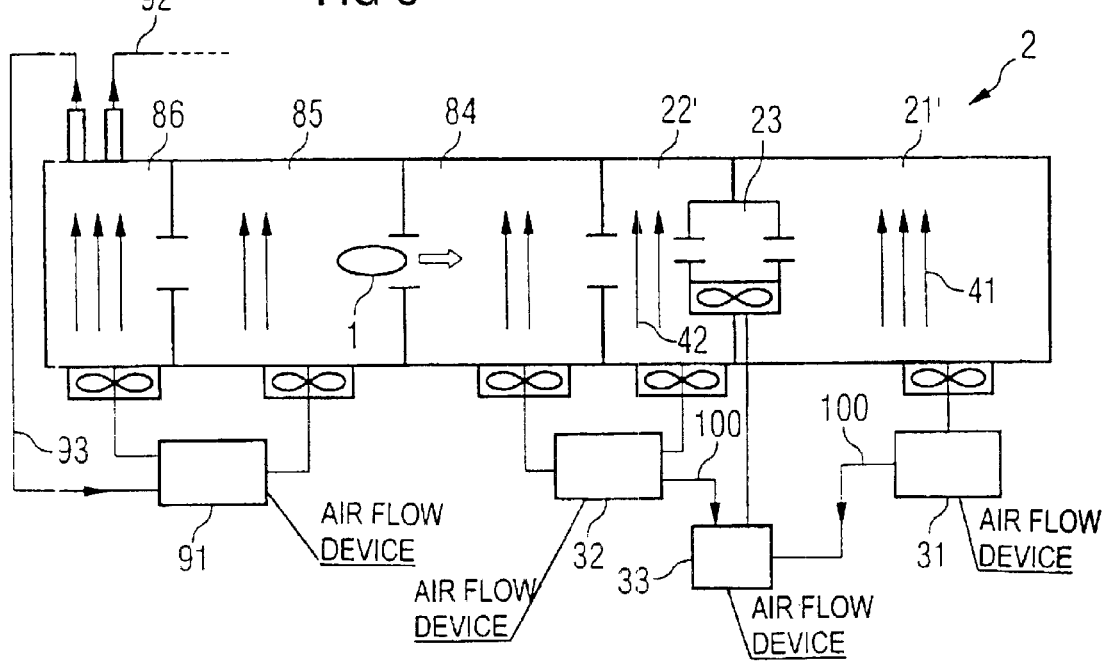

PROCESS FACILITY HAVING AT LEAST TWO PHYSICAL UNITS EACH HAVING A REDUCED DENSITY OF CONTAMINATING PARTICLES WITH RESPECT TO THE SURROUNDINGS

BACKGROUND OF THE INVENTION

Field of the Invention

The present invention relates to a configuration of at least two physical units in a process facility for processing at least one semiconductor wafer in which the process units each have a reduced density of contaminating particles with respect to the surrounding area in the process facility, and also to a method of operating the configuration.

Such configurations are known from semiconductor fabrication shops, in which the clean room conditions of the halls are subject to increased requirements. Both the hall itself and the individual process facilities are in this case subject to strict specifications with regard to the maintenance of temperature, humidity, air pressure, air flow velocity, the density of contaminating particles, etc. Typical clean room plant systems therefore include sensors for measuring the appropriate parameters, which in a control loop, provide their data to the corresponding ventilation, cooling or heating and recirculation systems. The permissible variation ranges for the respective parameters are in this case mostly very small.

With the decreasing structure sizes on the semiconductor wafers, the range of sizes of contaminating particles, which can lead to damage to the integrated circuit on the wafer, becomes wider and wider. In this document, however, contaminating particles should be understood to mean macroscopic particles, which can settle out of the air onto an integrated circuit on the semiconductor wafer, and also chemical substances such as solutions, amines or other reactive substances. These can attack the wafers, often covered with sensitive layers, and therefore chemically change the surface. For example, in lithographic exposure facilities, the acids liberated by an acid former as a result of exposure can attack the sensitive resist surface of the still unexposed, following semiconductor wafers and therefore disadvantageously attenuate the photoactivity of the resist. On the other hand, the object lens can also be attacked as a result, which can lead to lens degradation, so that the lens either has to be cleaned more often—with the result of lower productivity—or the lenses have to be replaced after shorter intervals, as a result of a shorter lifetime, with the result of higher production costs.

In the aforementioned example, the cause is contamination within a reduced-contamination physical unit belonging to a lithographic exposure facility. It is in precisely such a facility, however, that the objective is normally to keep the level of contamination, that is to say the density of contaminating particles in the physical unit, particularly low as compared with the surrounding units. For the aforementioned case, therefore, effective protection can consist only in a particularly suitable plant for producing the mini environment, as it is known, in the aforementioned physical unit.

On the other hand, a typical problem is represented by the contamination source in the physical units surrounding the particularly sensitive physical unit of the exposure facility and belonging to what is known as the lithographic track. On automated transport paths, the semiconductor wafers pass through various stations such as a hot plate, cool plate, varnishing, pre-bake, etc. In the process, first the mechanical abrasion of the transport systems has a contaminating effect, but second, the processing of the substrate surface also acts as a contamination source. Many of these stations have their own physical units with their own devices for reducing the density of contaminating particles, that is to say plants for maintaining a respective mini environment. Of course, in this example the requirement on the reduced-contamination physical unit of the exposure facility is at its greatest with respect to the clean room parameters.

For the transfer of a semiconductor wafer from one physical unit to the next, a direct opening is needed between the physical units. In order nevertheless to be able to maintain the differentiated conditions, care is additionally taken that there is a slightly greater pressure in the physical unit having the more sensitive conditions—for example, an exposure facility—than in the adjacent physical unit, for example, a physical unit belonging to the lithographic track in the aforementioned example. Under this assumption, a minimum air flow leads through the opening out of the more sensitive physical unit, so that no new contaminating particles can penetrate.

The clean room conditions in the reduced-contamination physical units are also ensured, inter alia, by producing a laminar flow. For this purpose, the device for reducing the density of contaminating particles has a suitable ventilation system that produces a suitable flow with a flow velocity which is sufficiently low, for example 0.3 m/s, so that no turbulence is produced. As a result, contaminating particles once produced drift with the flow from an air inlet opening in the direction of an air outlet opening and are filtered there or are otherwise disposed of. It is important in this case that the air flow be oriented substantially parallel to the opening area of the opening leading to the adjacent physical unit. Therefore, between the physical units, no air exchange takes place directly as a result of the laminar flow, but only a minimum air flow which results from the pressure equalization. As a result of the only minimal permitted pressure differences between the two physical units, however, the problem can then arise that, as a result of sudden pressure changes or air movements—for example, during the transport of a wafer into the vicinity of the opening—the air flow can be deflected in the opposite direction. As a result, contaminating particles pass into the more sensitive of the two physical units.

SUMMARY OF THE INVENTION

It is accordingly an object of the invention to provide a process facility and a method for operating the process facility, which overcome the above-mentioned disadvantages of the prior art apparatus and methods of this general type.

In particular, it is an object of the invention to insure a lower density of contaminating particles in the more sensitive of two physical units in a process facility for semiconductor fabrication.

With the foregoing and other objects in view there is provided, in accordance with the invention, a process facility including: a first physical unit including a first device for reducing a density of contaminating particles therein with respect to an area surrounding the first physical unit, the first device providing a first laminar air flow at a first flow velocity; a second physical unit including a second device for reducing a density of contaminating particles therein with respect to an area surrounding the second physical unit, the second device providing a second laminar air flow at a second flow velocity; and a third physical unit formed with a first opening leading to the first physical unit and formed with a second opening leading to the second physical unit. The third physical unit forms a connection for transferring at least one semiconductor wafer between the first physical unit and the second physical unit. The third physical unit is formed with an air inlet slot and an air outlet slot. The third physical unit includes a third device for reducing a density of contaminating particles therein. The third device provides a third laminar air flow at a third flow velocity. The first laminar air flow and the second laminar air flow are aligned parallel with each other. The third laminar air flow is oriented substantially at right angles to the first laminar air flow and the second laminar air flow.

In accordance with an added feature of the invention, the third flow velocity is slightly larger than the first flow velocity and slightly larger than the second flow velocity such that near the first opening and near the second opening, no turbulence is produced as a result of a pressure difference established between the first physical unit and the third physical unit and a pressure difference established between the second physical unit and the third physical unit.

In accordance with an additional feature of the invention, the semiconductor wafer has a flat surface; the process facility includes a transfer device for transferring the semiconductor wafer from the first physical unit into the second physical unit via the third physical unit; and the transfer device configuring the flat surface of the semiconductor wafer along the third laminar air flow during a transfer within the third physical unit.

In accordance with another feature of the invention, the first opening and the second opening are configured opposite each other.

In accordance with a further feature of the invention, the process facility is a lithographic cluster, the first physical unit is part of a lithographic track, and the second physical unit is part of an exposure facility for flat semiconductor wafers.

With the foregoing and other objects in view there is also provided, in accordance with the invention, a method of operating the described process facility. The method includes steps of: producing the first laminar air flow at the first flow velocity using the first device in the first physical unit; producing the second laminar air flow at the second flow velocity using the second device in the second physical unit; and producing the third laminar air flow at the third flow velocity using the third device in the third physical unit such that the third laminar air flow is at right angles to the first laminar air flow and the second laminar air flow.

In accordance with an added mode of the invention, the method includes steps of: measuring a first pressure in the first physical unit; measuring a second pressure in the second physical unit; measuring a third pressure in the third physical unit; comparing the third pressure with the second pressure and the first pressure; and adjusting the third flow velocity of the third laminar air flow in the third physical unit as a result of the comparing step.

In accordance with an additional mode of the invention, the adjusting step is performed such that the third pressure is lower than the first pressure and the second pressure.

According to the invention, the prior art direct opening between the first and the second physical unit is replaced by a third physical unit having openings to the first and second physical unit. The third physical unit is provided with a dedicated device for reducing the density of contaminating particles which, by producing an appropriate air flow for the third physical unit, can set its own parameters for the clean room conditions, in particular the flow velocity. The direction of the flow, determined by suitable application of the device, is substantially parallel to the area respectively formed by the first and second opening to the adjacent physical units. As distinct from the parallel alignment according to the prior art of adjacent laminar flows in adjacent physical units, the flow direction in the third physical unit is aligned at right angles to the first and second air flows in the adjacent physical units.

The advantage of the invention becomes particularly clear when using the inventive method of operating the process facility.

In the three adjacent physical units, in each case the pressures are measured, after which the third pressure is in each case compared with the first and second pressure. The result of this comparison serves as an input to the device for reducing contaminating particles in the third physical unit which, in order to achieve a lower pressure, adapts the flow velocity of the laminar flow anew as a result of the measured pressure differences. According to the Bernoulli equation:

$$\frac{1}{2}V_{air}^2 + P + \rho g h = const$$

where $V_{air}$ is the air flow velocity, g is the acceleration due to gravity and P is the isotropic, static air pressure, the pressure decreases when the flow velocity is increased and vice versa. That is to say, the total pressure is composed of the dynamic pressure given by the flow velocity and the static pressure given by the thermal characteristics of the air and also a barometric term that can be disregarded here. According to the invention, therefore, by setting an appropriate flow velocity using the device for reducing contaminating particles, a slight negative pressure is produced as compared with the surrounding physical units.

This advantageously enables contaminating particles to pass from the first physical unit and contaminating particles to pass from the second physical unit into the third physical unit, but not vice versa. By way of the laminar flow in the third physical unit, the contaminating particles are picked up in the third physical unit via the minimum air flow, which does not produce any turbulence, and are led to the air outlet slot present in the third physical unit, in order to be filtered out there. In particular, the transition of contaminating particles from the first into the second physical unit is thereby made considerably more difficult. Thus, an advantageous reduction in the density of contaminating particles is achieved in particular in a physical unit that is sensitive with respect to contaminating particles, as compared with the other physical unit.

In a further refinement, the third flow velocity is slightly larger than the first and second flow velocity, in such way that, in the area of the first and the second opening, no turbulence is produced as a result of the pressure difference established between the first and third physical unit and between the second and third physical unit.

In a further refinement, a device for transferring a semiconductor wafer from the first via the third into the second physical unit is configured in such a way that the flat surface of the semiconductor wafer is configured along the laminar air flow in the third physical unit during the transfer within the third physical unit. As a result, first the turbulence at the edges of the wafer is minimized, and second the air flow running along the surface possibly removes contaminating particles deposited on the surface.

The laminar air flow in the third physical unit is preferably focused narrowly and exactly, and the third physical unit preferably has an extent which is small as compared with the first and second physical unit.

In a preferable refinement, the third physical unit is used as an intermediate buffer for semiconductor wafers waiting to be processed in the adjacent physical unit. The advantage is that, during the buffering, particles that flake off from the wafer surface are removed immediately and do not pass onward into the physical units for the further processing. In particular, semiconductor wafers cooling down after a heating process can in this case be responsible as a contamination source.

In a further refinement, the first and the second opening in the third physical unit are configured opposite each other. First, this configuration simplifies the transport of a wafer from the first into the second physical unit through the third physical unit, and second, in this configuration, the maintenance of a laminar air flow is better ensured.

In a particularly advantageous refinement, the process facility is a lithographic cluster in which a first physical unit is part of a lithographic track, and a second physical unit is part of a lithographic exposure facility for flat semiconductor wafers. In such process facilities there are, first, particularly high absolute requirements on the clean room conditions in the physical unit that is sensitive with respect to contaminating particles, namely the exposure facility. Second, here the differences between these requirements relating to the adjacent physical units are particularly great as a result of the numerous chemical and heating processes in the lithographic track.

Other features which are considered as characteristic for the invention are set forth in the appended claims.

Although the invention is illustrated and described herein as embodied in a process facility having at least two physical units each having a reduced density of contaminating particles with respect to the surroundings, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4A is a diagram showing the alignment of the laminar flow from an air inlet to an air outlet slot in the third physical unit in which a semiconductor wafer is not located in the third physical unit;

FIG. 4B is a diagram showing the alignment of the laminar flow from an air inlet to an air outlet slot in the third physical unit in which a semiconductor wafer is located in the third physical unit; and FIG. 5 is a diagram showing an exemplary embodiment of a lithographic cluster having a number of conventional physical units and a physical unit constructed according to the invention serving as an air lock between two conventional physical units.

DESCRIPTION OF THE PREFERRED EMBODIMENTS

Figure 1:
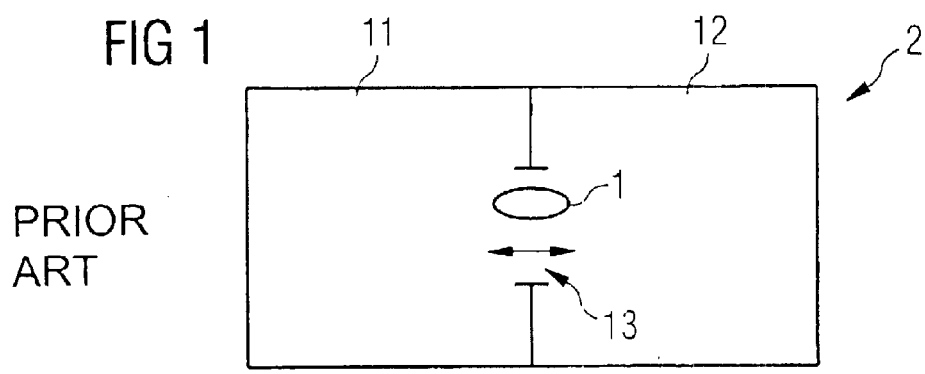
FIG. 1 is a diagram showing two prior art reduced-contamination physical units that are connected to each other directly by an opening.

Referring now to the figures of the drawing in detail and first, particularly, to FIG. 1 thereof, there is shown a process facility 2 having a prior art configuration of two physical units 11, 12. The process facility 2 has an opening 13 for transferring a semiconductor wafer 1 between the physical units 11, 12. The physical units 11, 12 are sealed off physically and have a reduced density of contaminating particles with respect to their surroundings. The surroundings can, for example, be the clean room area in semiconductor fabrication. With the introduction of 300 mm technologies, a change was made to keep the semiconductor wafers predominantly in boxes, FOUPs (Front Opening Unified Pod), as they are known, in which even reduced particle densities are present with respect to the surrounding clean room. These FOUPs are preferably connected directly to the process facilities, and the mini environment of the FOUP is directly connected to that of a physical unit 11 or 12 of the process facility 2. In this way, semiconductor wafers 4 can be fed directly to the process facility 2. It is also conceivable for the FOUP itself to represent a physical unit 11 or 12 according to the present invention.

Figure 2:
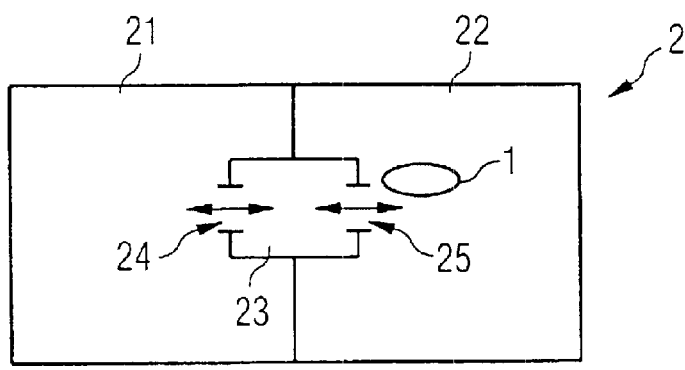
FIG. 2 is a diagram showing two reduced-contamination physical units that are connected to each other via the openings of a third physical unit.

FIG. 2 shows a process facility 2 having an inventive configuration of two physical units 21 and 22 and a third physical unit 23 which is configured between the two physical units 21 and 22 instead of the opening 13 used in the prior art. The physical unit 23 has two openings—one to the first physical unit 21 and one to the second physical unit 22. These are used to transfer the semiconductor wafer 1 from the physical unit 21 into the third physical unit 23 and from the third physical unit 23 into the second physical unit 22.

The function of the physical units 21 and 22 corresponds to that of the physical units 11 and 12 used in the prior art. They are used to maintain a mini environment, that is to say an area with a reduced density of contaminating particles, constant pressure and temperature etc., and constitute either buffer areas for semiconductor wafers 1, loading and unloading areas for process chambers or process chambers themselves. The case of a FOUP or similarly closed wafer container as a physical unit 21, 22 is also included by the invention.

Figure 3:
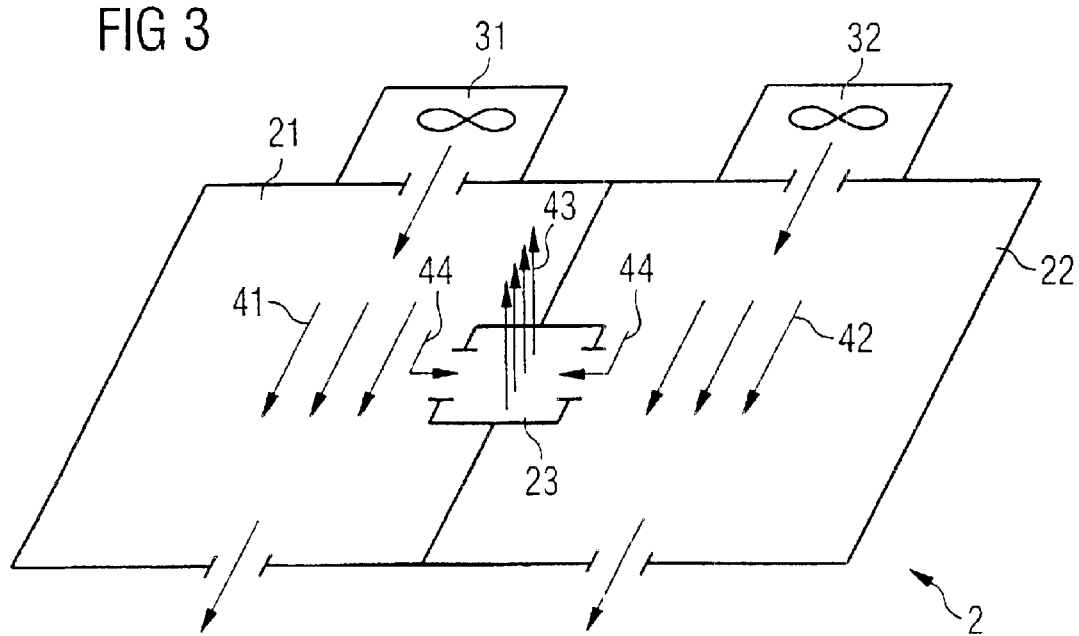
FIG. 3 is an oblique projection showing the alignment of the laminar flow in the three physical units.

FIG. 3 is a projected oblique plan view of the configuration shown in FIG. 2. The flow directions of the laminar air flow 41, 42, 43 are produced by devices for reducing the density of contaminating particles. In this case, the laminar air flow 41 produced by the device 31 in the first physical unit 21 is parallel to the laminar air flow 42 produced by the device 32 in the physical unit 22.

The device 33 not shown in FIG. 3 (See FIGS. 4A and 4B) produces a laminar air flow 43 at right angles to the laminar air flows 41 and 42 of the physical units 21 and 22. However, all three laminar air flows in the three physical units have the property of being oriented parallel to the opening areas of the openings 24 and 25, so that the laminar air flows just do not pass through the openings 24, 25.

In the physical unit 23, the device 33 sets the speed of the laminar flow 43 to be greater than the flow velocity of the laminar flows 41 and 42 in such a way that, in accordance with the Bernoulli equation, the static pressure in the physical unit 23 is lower than in the surrounding physical units 21 and 22. However, this static pressure difference is so low that no turbulence is produced at the openings 24 and 25. On the other hand, minimum air flows 44 branch off from the laminar flow 41, 42 in order to balance the pressure difference, enter the third physical unit 23 through the openings 24, 25 and are carried along there by the laminar flow 43 without forming turbulence.

FIG. 4A schematically shows the third physical unit 23 having an air inlet slot 51 and an air outlet slot 52 for the laminar flow 43 produced by the device for reducing the density of contaminating particles. The inventive handling of the transport of a semiconductor wafer 1 in the third physical unit 23 is shown in FIG. 4B. The flat semiconductor wafer 1 is moved through the laminar flow 43 of the physical unit 23 in such a way that it poses the lowest possible resistance to the laminar flow. According to the invention, this is made possible by aligning the semiconductor wafer in parallel with the laminar flow 43. The automatic handling systems for transferring the wafer 1 from the physical unit 21 into the second physical unit 22 are aligned appropriately for this purpose. It is also possible for the handling systems to carry out a slow rotational movement of the semiconductor wafer during the transfer from the first physical unit 21 into the third physical unit 23 so that, in order to avoid turbulence, the wafer is continuously aligned parallel to the laminar flow 41 and 43.

FIG. 5 shows an exemplary embodiment of a lithographic cluster. In this figure it is possible to see a configuration of five successive physical units 86, 85, 84, 22', 21', to which, in addition, according to the invention the third physical unit 23 is assigned. In order to avoid turbulence, the laminar flows in each of these physical units are aligned in parallel, with the exception of the laminar flow 43 in the physical unit 23, which projects at right angles out of the drawing plane of FIG. 5. The physical unit 21' corresponds to an exposure facility for the optical projection of a semiconductor wafer 1. Here, the highest requirements on the clean room specifications apply. The physical units 86, 85, 84, 22' are physical units belonging to the lithographic track, in which preprocessing or post-processing is carried out before or after the exposure of a wafer in the exposure facility 21', for example, for performing the varnishing, various bake steps, developer or cooling steps, etc. Between the physical units there are openings to transfer the semiconductor wafer 1 to the next process step.

In order to take account of the increased requirements on the mini environment, the third physical unit 23 is provided between the physical unit 21' and the physical unit 22'. The physical unit 23 prevents the air flow that is in the physical unit 22' and that is affected by contamination as compared with the physical unit 21', from getting into the physical unit 21' in the event of low air pressure fluctuations or during semiconductor wafer transfers.

Each of the physical units 21', 22' and 23 include sensors for measuring pressure and temperature are fitted. These sensors feed back the currently measured values in a control loop to the respective devices 31, 32, 33 for reducing the density of contaminating particles. These devices 31, 32, 33 in each case maintain respective constant clean room conditions. However, these are also coupled to one another via signal lines 100, so that the device 33 can carry out a comparison of the pressures and temperatures between the physical unit 23 and the adjacent physical units. As a reaction to this, the device 33 can adapt the laminar flow 43 in such a way that, as a result of a higher flow velocity, a comparatively lower static pressure is present.

For the physical unit 86, a configuration that can be transferred to the physical unit 23 is illustrated by way of example. The laminar flow 92 emerging through an air outlet slot is in this case discharged into the surrounding hall ventilation. Another part of the laminar flow 93 is recycled, however, and fed again, via a filter system, to the device 91 for producing the laminar air flow.

In a further refinement, the physical unit 23 serves as a buffer station for the exposure facility having the physical unit 21'. In this case, a plurality of semiconductor wafers 1 can also remain in the physical unit 23 at the same time. The focused air flow transverse to the wafer surface ensures an additional cleaning effect here.

Examples of flow velocities in the physical unit 21', 22' and 23 are respectively 0.3 m/s, the relative humidity is in each case 40%, the temperature in the lithographic track and the physical unit 23 is around 22° C., and in the exposure facility the temperature is around 23° C.

We claim:

1. A process facility, comprising:
   a first physical unit including a first device for reducing a density of contaminating particles therein with respect to an area surrounding said first physical unit, said first device providing a first laminar air flow at a first flow velocity;
   a second physical unit including a second device for reducing a density of contaminating particles therein with respect to an area surrounding said second physical unit, said second device providing a second laminar air flow at a second flow velocity; and
   a third physical unit formed with a first opening leading to said first physical unit and formed with a second opening leading to said second physical unit, said first and second openings having areas being substantially parallel to each other;
   said third physical unit forming a connection for transferring at least one semiconductor wafer between said first physical unit and said second physical unit;
   said third physical unit formed with an air inlet slot and an air outlet slot;
   said third physical unit including a third device for reducing a density of contaminating particles therein;
   said third device providing a third laminar air flow at a third flow velocity;
   the first laminar air flow and the second laminar air flow being aligned parallel with each other;
   the third laminar air flow being oriented substantially at right angles to the first laminar air flow and the second laminar air flow; and
   the first laminar air flow, the second laminar air flow, and the third laminar air flow being oriented substantially parallel to said areas of said first and second openings.

2. The process facility according to claim 1, wherein the third flow velocity is slightly larger than the first flow velocity and slightly larger than the second flow velocity such that near said first opening and near said second opening, no turbulence is produced as a result of a pressure difference established between said first physical unit and said third physical unit and a pressure difference established between said second physical unit and said third physical unit.

3. The process facility according to claim 1, in combination with the semiconductor wafer, wherein:
   the semiconductor wafer has a flat surface;
   the process facility includes a transfer device for transferring the semiconductor wafer from said first physical unit into said second physical unit via said third physical unit; and
   said transfer device configuring the flat surface of the semiconductor wafer along the third laminar air flow during a transfer within said third physical unit.

4. The process facility according to claim 1, wherein said first opening and said second opening are configured opposite each other.

5. The process facility according to claim 1, wherein said first physical unit is part of a lithographic track, and said second physical unit is part of an exposure facility for flat semiconductor wafers.

6. A lithographic cluster, comprising:

a first physical unit including a first device for reducing a density of contaminating particles therein with respect to an area surrounding said first physical unit, said first device providing a first laminar air flow at a first flow velocity;

a second physical unit including a second device for reducing a density of contaminating particles therein with respect to an area surrounding said second physical unit, said second device providing a second laminar air flow at a second flow velocity;

a third physical unit formed with a first opening leading to said first physical unit and formed with a second opening leading to said second physical unit, said first and second openings having areas being substantially parallel to each other;

said third physical unit forming a connection for transferring at least one semiconductor wafer between said first physical unit and said second physical unit;

said third physical unit formed with an air inlet slot and an air outlet slot;

said third physical unit including a third device for reducing a density of contaminating particles therein;

said third device providing a third laminar air flow at a third flow velocity;

the first laminar air flow and the second laminar air flow being aligned parallel with each other;

the third laminar air flow being oriented substantially at right angles to the first laminar air flow and the second laminar air flow;

the first laminar air flow, the second laminar air flow, and the third laminar air flow being oriented substantially parallel to said areas of said first and second openings;

said first physical unit being part of a lithographic track; and said second physical unit being part of an exposure facility for flat semiconductor wafers.

7. A method of operating the process facility according to claim 1, the method which comprises:

producing the first laminar air flow at the first flow velocity using said first device in said first physical unit;

producing the second laminar air flow at the second flow velocity using said second device in said second physical unit; and producing the third laminar air flow at the third flow velocity using said third device in said third physical unit such that the third laminar air flow is at right angles to the first laminar air flow and the second laminar air flow.

8. The method according to claim 7, which comprises:

measuring a first pressure in said first physical unit;

measuring a second pressure in said second physical unit;

measuring a third pressure in said third physical unit;

comparing the third pressure with the second pressure and the first pressure; and adjusting the third flow velocity of the third laminar air flow in said third physical unit as a result of the comparing step.

9. The method according to claim 8, which comprises performing the adjusting step such that the third pressure is lower than the first pressure and the second pressure.

* * * * *

UNITED STATES PATENT AND TRADEMARK OFFICE
CERTIFICATE OF CORRECTION

PATENT NO.     : 6,797,029 B2
DATED          : September 28, 2004
INVENTOR(S)    : Kay Lederer et al.

It is certified that error appears in the above-identified patent and that said Letters Patent is hereby corrected as shown below:

<u>Title page,</u>
Item [73], Assignee should read -- Infineon Technologies AG --

Signed and Sealed this

Twenty-fourth Day of May, 2005

JON W. DUDAS
*Director of the United States Patent and Trademark Office*